(12) United States Patent
Hudelson et al.

(10) Patent No.: US 10,415,149 B2
(45) Date of Patent: Sep. 17, 2019

(54) GROWTH OF A SHAPED SILICON INGOT BY FEEDING LIQUID ONTO A SHAPED INGOT

(71) Applicant: Silfex, Inc., Eaton, OH (US)

(72) Inventors: George David Stephen Hudelson, Billerica, MA (US); Igor Peidous, Liberty Township, OH (US); Haresh Siriwardane, Oakwood, OH (US); Steven M. Joslin, Liberty Township, OH (US); Jihong Chen, Cincinnati, OH (US)

(73) Assignee: SILFEX, INC., Eaton, OH (US)

( * ) Notice: Subject to any disclaimer, the term of this patent is extended or adjusted under 35 U.S.C. 154(b) by 0 days.

(21) Appl. No.: 15/920,001

(22) Filed: Mar. 13, 2018

(65) Prior Publication Data

US 2018/0282898 A1 Oct. 4, 2018

Related U.S. Application Data

(60) Provisional application No. 62/479,907, filed on Mar. 31, 2017.

(51) Int. Cl.
| | | |
|---|---|---|
| *C30B 15/02* | (2006.01) | |
| *C30B 11/10* | (2006.01) | |
| *C30B 11/00* | (2006.01) | |
| *C30B 29/06* | (2006.01) | |
| *C30B 29/64* | (2006.01) | |

(52) U.S. Cl.
CPC ........... *C30B 11/10* (2013.01); *C30B 11/001* (2013.01); *C30B 11/002* (2013.01); *C30B 11/006* (2013.01); *C30B 29/06* (2013.01); *C30B 29/64* (2013.01)

(58) Field of Classification Search
CPC ......... C30B 15/02; C30B 15/22; C30B 15/26; C30B 15/30; C30B 29/16
See application file for complete search history.

(56) References Cited

U.S. PATENT DOCUMENTS

| | | | | |
|---|---|---|---|---|
| 5,178,720 A | * | 1/1993 | Frederick | ................ C30B 15/30 117/20 |
| 5,665,195 A | * | 9/1997 | Natarajan | ........... B32B 37/0023 156/381 |
| 5,866,094 A | | 2/1999 | Niikura | |

(Continued)

OTHER PUBLICATIONS

Y. Maeda et al, J Electrochem Soc.: Solid-state science and technology, vol. 133, No. 2, (1986) p. 440. "Releasing Material for the Growth of Shaped Silicon Crystals".

(Continued)

*Primary Examiner* — Robert M Kunemund (57) ABSTRACT

A system comprises a silicon seed arranged on a pedestal, where the silicon seed is ring shaped and is configured to receive melted silicon at a feed rate to form an ingot, and where the pedestal is configured to rotate at a rotational speed. A controller is configured to, while the silicon seed receives the melted silicon and while the ingot is forming: receive feedback regarding a diameter of the ingot and regarding an angle of a meniscus of the ingot, and control the rotational speed of the pedestal and the feed rate of the melted silicon based on the feedback to control the diameter of the ingot and the angle of the meniscus of the ingot.

20 Claims, 8 Drawing Sheets

(56) References Cited

U.S. PATENT DOCUMENTS

| | | | |
|---|---|---|---|
| 6,077,345 A * | 6/2000 | Easoz | C30B 15/02 |
| | | | 117/14 |
| 8,409,348 B2 * | 4/2013 | Tanaka | C30B 29/16 |
| | | | 117/37 |
| 9,315,917 B2 | 4/2016 | Stoddard et al. | |
| 2005/0112855 A1 | 5/2005 | Cretella et al. | |
| 2011/0146564 A1 * | 6/2011 | Ohtsuna | C30B 15/26 |
| | | | 117/15 |
| 2012/0067272 A1 * | 3/2012 | Banba | C30B 15/22 |
| | | | 117/15 |

OTHER PUBLICATIONS

V. Pupazan, et al., Journal of Crystal Growth (2014), http://dx.doi.org/10.1016/j.jcrysgro.2014.02.038i "Effects of crucible coating on the quality of multicrystalline silicon grown by a Bridgman technique".

\* cited by examiner

GROWTH OF A SHAPED SILICON INGOT BY FEEDING LIQUID ONTO A SHAPED INGOT

CROSS-REFERENCE TO RELATED APPLICATIONS

This application claims the benefit of U.S. Provisional Application No. 62/479,907, filed on Mar. 31, 2017. The entire disclosure of the application referenced above is incorporated herein by reference.

FIELD

The present disclosure relates to casting of near net shape ingots using materials including silicon.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Directional solidification of multi-crystalline ingots is used to grow silicon material in either square or round shapes. The ingots are then shaped into ring-shaped blanks and further machined to make parts. For example, the parts may be used as components inside substrate processing systems for deposition, etching or other treatment of substrates such as semiconductor wafers.

There are several problems with the current technology. For example, most inefficiently use silicon material. A shape of the ingot that is grown is usually different than a shape of the part to be machined. As a result, significant machining of excess material is required. Other issues include removal of outer material on square ingots and removal of a central core from round or square ingots. The removed material is wasted.

Crucible coatings may be used to prevent sticking and to allow release of ingots from crucibles. However, the coatings are a source of contamination. A typical process involves the melting, stabilization, freezing, and annealing of ingots all in a sequence, in the same hotzone/crucible. The complexity reduces throughput. While current processes for ingot growth can be used to produce a solid ingot, they generally do not allow production of a near net shape ingot.

SUMMARY

A system comprises a silicon seed arranged on a pedestal, where the silicon seed is ring shaped and is configured to receive melted silicon at a feed rate to form an ingot, and where the pedestal is configured to rotate at a rotational speed. A controller is configured to, while the silicon seed receives the melted silicon and while the ingot is forming: receive feedback regarding a diameter of the ingot and regarding an angle of a meniscus of the ingot, and control the rotational speed of the pedestal and the feed rate of the melted silicon based on the feedback to control the diameter of the ingot and the angle of the meniscus of the ingot.

In other features, the silicon seed receives the melted silicon from a feeding system positioned above the silicon seed and away from a center of the silicon seed.

In other features, the controller receives the feedback from a camera directed to the meniscus of the ingot.

In other features, the system further comprises a crucible configured to receive pieces of solid silicon, the crucible being arranged above the silicon seed and away from a center of the silicon seed; and a heater associated with the crucible configured to melt the pieces of solid silicon. The controller outputs a control signal based on the feedback to move the pedestal downward from the crucible and the heater at a speed while the silicon seed receives the melted silicon from the crucible and while the ingot is forming. The speed at which the pedestal moves downward from the crucible and the heater controls the diameter of the ingot and the angle of the meniscus of the ingot.

In other features, the system further comprises heaters associated with a lower portion of the crucible that is configured to feed the melted silicon to the silicon seed. The controller controls power supplied to the heaters based on the feedback to control the diameter of the ingot.

In other features, the system further comprises a sprayer to at least intermittently spray the pieces of solid silicon with a dopant before the pieces of solid silicon are fed into the crucible.

In other features, the system further comprises a quartz tube associated with an outer diameter of the silicon seed to control an outer diameter of the ingot. The controller controls an inner diameter of the ingot by controlling the rotational speed of the pedestal based on the feedback.

In other features, the system further comprises outer and inner quartz tubes associated with outer and inner diameters of the silicon seed to control outer and inner diameters of the ingot.

In other features, the inner quartz tube comprises a stress relief feature designed to cause the inner quartz tube to yield or break while the ingot cools; or the inner quartz tube is conical in shape.

In other features, the system further comprises an outer quartz tube and an inner tube associated with outer and inner diameters of the silicon seed to control outer and inner diameters of the ingot, where the inner tube is made of a material other than quartz.

In other features, the system further comprises a solid rod of a dopant arranged to melt directly into the meniscus of the ingot.

In still other features, a method comprises feeding a silicon seed arranged on a pedestal with melted silicon at a feed rate to form an ingot, the silicon seed being ring shaped, and the pedestal being configured to rotate at a rotational speed. The method further comprises while the silicon seed receives the melted silicon and while the ingot is forming: receiving, from a camera directed to a meniscus of the ingot, feedback regarding a diameter of the ingot and regarding an angle of the meniscus of the ingot, and controlling the rotational speed of the pedestal and the feed rate of the melted silicon based on the feedback to control the diameter of the ingot and the angle of the meniscus of the ingot.

In other features, the method further comprises positioning a feeding system above the silicon seed and away from a center of the silicon seed; and supplying the melted silicon from the feeding system to the silicon seed at the feed rate.

In other features, the method further comprises arranging a crucible above the silicon seed and away from a center of the silicon seed; supplying pieces of solid silicon to the crucible while selectively spraying the pieces of solid silicon with a dopant before feeding the pieces of solid silicon into the crucible; and melting the pieces of solid silicon using a heater associated with the crucible. The method further comprises moving the pedestal downward from the crucible and the heater at a speed while the ring shaped silicon seed receives the melted silicon from the crucible and while the ingot is forming; and controlling, based on the feedback, the speed at which the pedestal moves downward from the crucible and the heater to control the diameter of the ingot and the angle of the meniscus of the ingot.

In other features, the method further comprises arranging heaters proximate to a lower portion of the crucible that is configured to feed the melted silicon to the silicon seed; and controlling power supplied to the heaters based on the feedback to control the diameter of the ingot.

In other features, the method further comprises controlling an outer diameter of the ingot by arranging a quartz tube proximate to an outer diameter of the silicon seed; and controlling an inner diameter of the ingot by controlling the rotational speed of the pedestal based on the feedback.

In other features, the method further comprises controlling outer and inner diameters of the ingot by arranging outer and inner quartz tubes proximate to outer and inner diameters of the silicon seed.

In other features, the inner quartz tube comprises a stress relief feature designed to cause the inner quartz tube to yield or break while the ingot cools; or the inner quartz tube is conical in shape.

In other features, the method further comprises controlling outer and inner diameters of the ingot by arranging an outer quartz tube and an inner tube proximate to outer and inner diameters of the silicon seed, where the inner tube is made of a material other than quartz.

In other features, the method further comprises arranging a solid rod of a dopant to melt directly into the meniscus of the ingot.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 1A-3 are functional block diagrams of examples of systems for casting near net shape ingots from a material including silicon according to the present disclosure;

In the drawings, reference numbers may be reused to identify similar and/or identical elements.

DETAILED DESCRIPTION

Systems and methods according to the present disclosure produce near net shape ingots from material including silicon. There are several variations described herein, with different solutions for control of the geometry (e.g., diameter) of the ingot and/or control of the doping level in the ingot.

In one example, the ingot is grown on a seed with no inner or outer crucible walls. Diameter control of the ingot may be achieved using differential heat addition/removal (heaters) on the inner and outer diameters, addition rate and pull speed of the ingot to control liquid-solid interface (meniscus) height/angle, rotation rate of the crucible to modulate the centrifugal force on the meniscus, and/or controlling the meniscus angle. Feedback on the diameter may be provided by cameras imaging the inner and outer diameters and meniscus angles.

In order to provide the correct amount of dopant to the crystal in a uniform manner, several solutions are envisioned. In some examples, there are two streams of materials supplied to a melting crucible (see, e.g., FIGS. 1A-3) including one stream of un-doped (virgin) polysilicon chunks and a second stream of doped material.

Figure 1A:
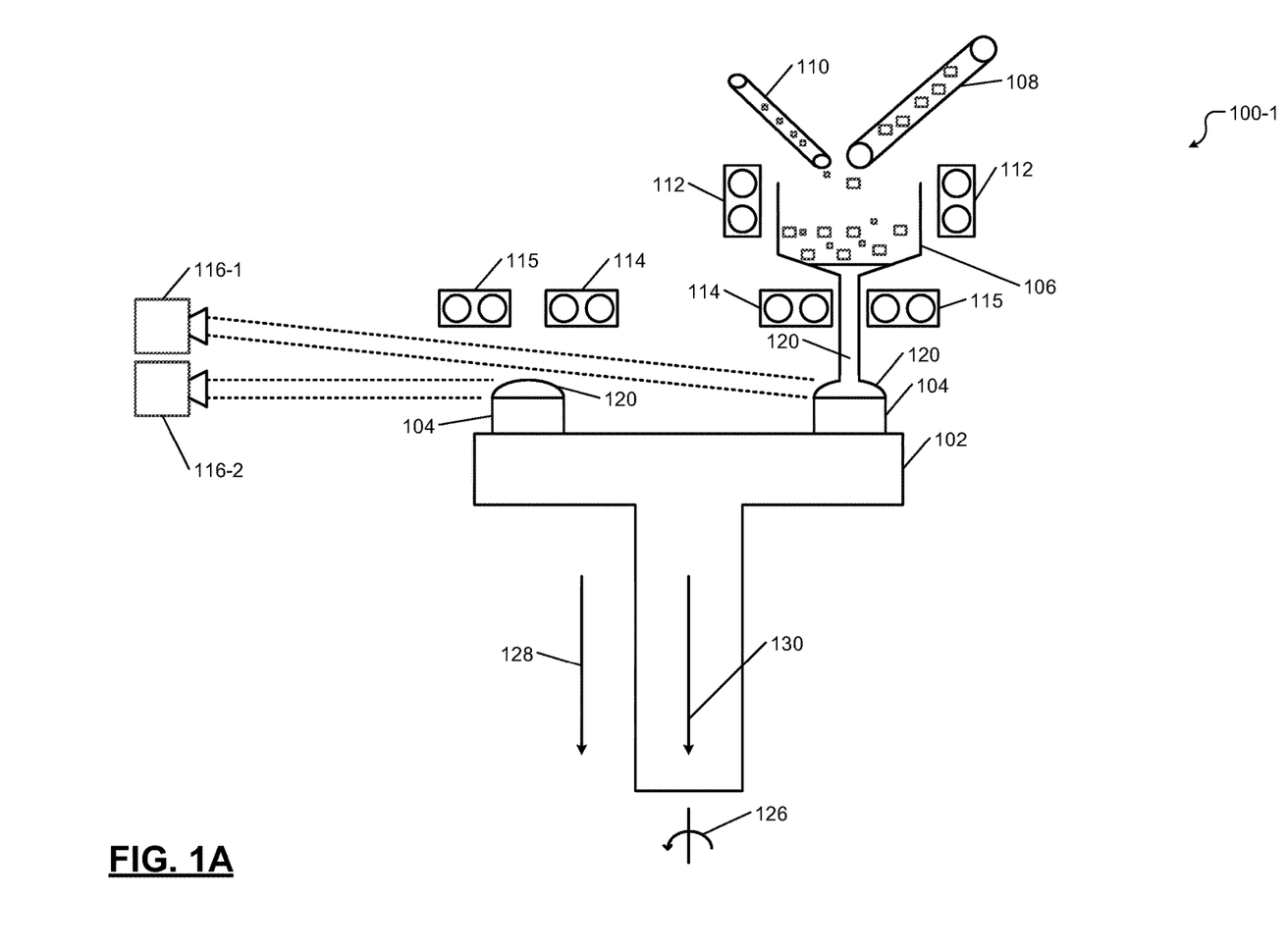

Referring now to FIG. 1A, a system 100-1 for casting near net shape ingots from a material including silicon is shown, where liquid silicon is fed onto a silicon seed. The system 100-1 comprises a pedestal 102, a silicon seed (or seed) 104, a melting crucible 106, a feeder 108 for feeding solid feedstock to the melting crucible 106, a feeding tube 110 for feeding dopant to the melting crucible 106, a melting heater 112, inner and outer heaters 114 and 115, cameras 116-1 and 116-2 (collectively cameras 116) for inner and outer diameter (ID/OD) control, and a controller 118 (shown in FIG. 1B).

The melting heater 112 melts a mixture of solid feedstock and dopant in the melting crucible 106 to form liquid silicon 120. The liquid silicon 120 is fed onto the silicon seed 104. The cameras 116 monitor the inner and outer diameters (ID/OD) and the meniscus angle.

Figure 1B:
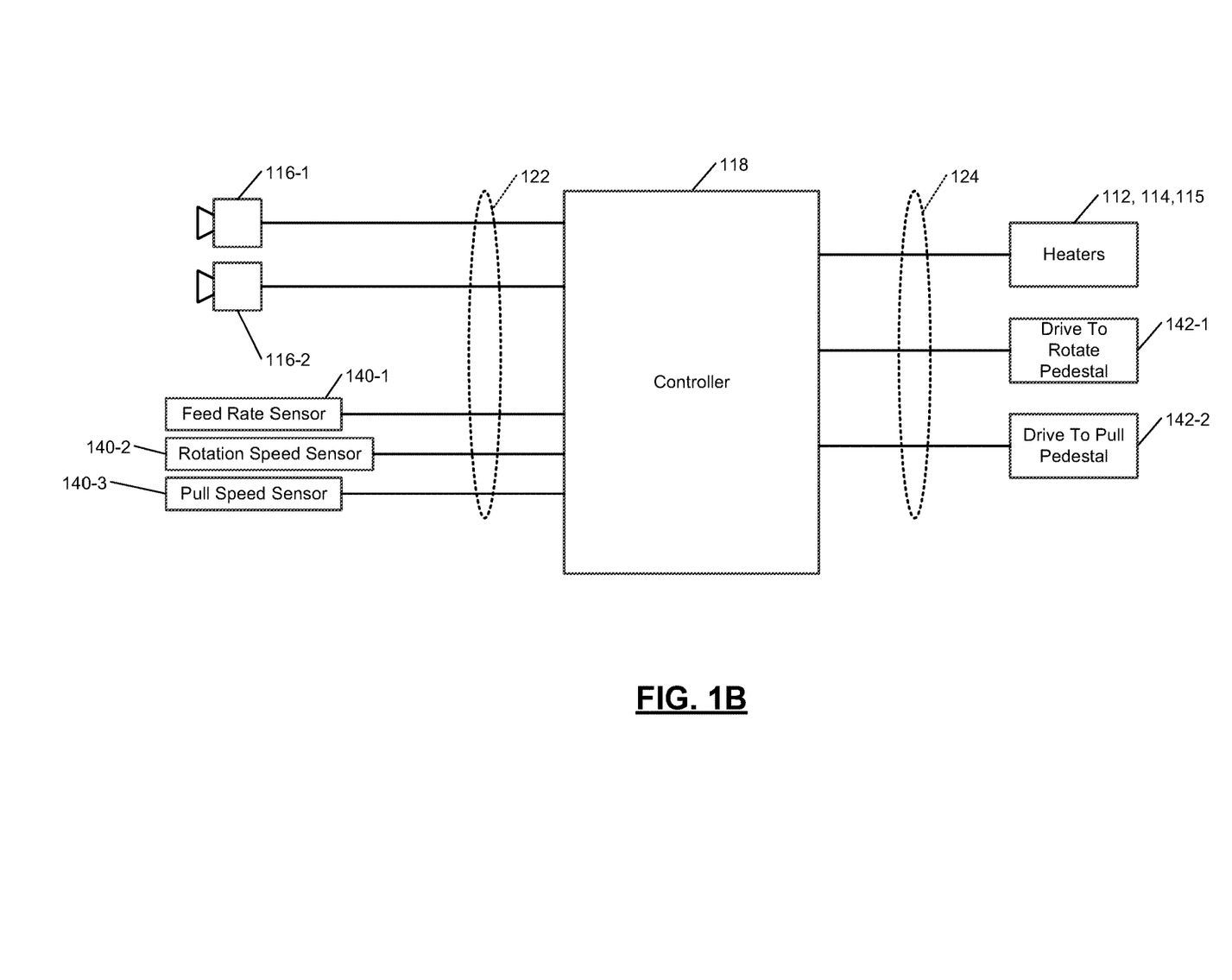

In FIG. 1B, the controller 118 receives feedback 122 from the cameras 116. The controller 118 may also receive feedback 122 from suitable sensors (e.g., sensors 140-1, 104-2, and 140-3) regarding a feed rate of the liquid silicon 120 and regarding a rotation rate 126 and a pull speed 128 of the pedestal 102. For example, the feed rate of the liquid silicon 120 (i.e., the rate at which the liquid silicon is supplied to the silicon seed 104) can depend on the amount of solid silicon melted in the melting crucible 106, which in turn may depend on the amount of solid silicon supplied by the feeder 108 to the melting crucible 106 and also on the amount of power supplied to the melting heater 112. The controller 118 outputs control signals 124 based on the feedback 122 to control the meniscus angle and meniscus height. The control signals 124 are input to the heaters 112, 114, and 115, and to drives 142-1 and 142-2 that rotate and pull the pedestal 102 while the liquid silicon is supplied to the silicon seed 104 and while the ingot forms. The control signals 124 control the meniscus angle and meniscus height by controlling power supplied to the heaters 112, 114, and 115, the rotation rate 126 and the pull speed 128 of the pedestal 102, and the feed rate of the liquid silicon 120 based on the feedback. Heat flows in the direction shown as 130.

Crystal geometry may be controlled by using differential heater power (inner and outer heaters 114 and 115) to control meniscus angle (inner diameter and outer diameter), using rotation speed to control inner and outer meniscus angle, or using feed rate of liquid silicon to control meniscus height and meniscus angle.

Figure 2:
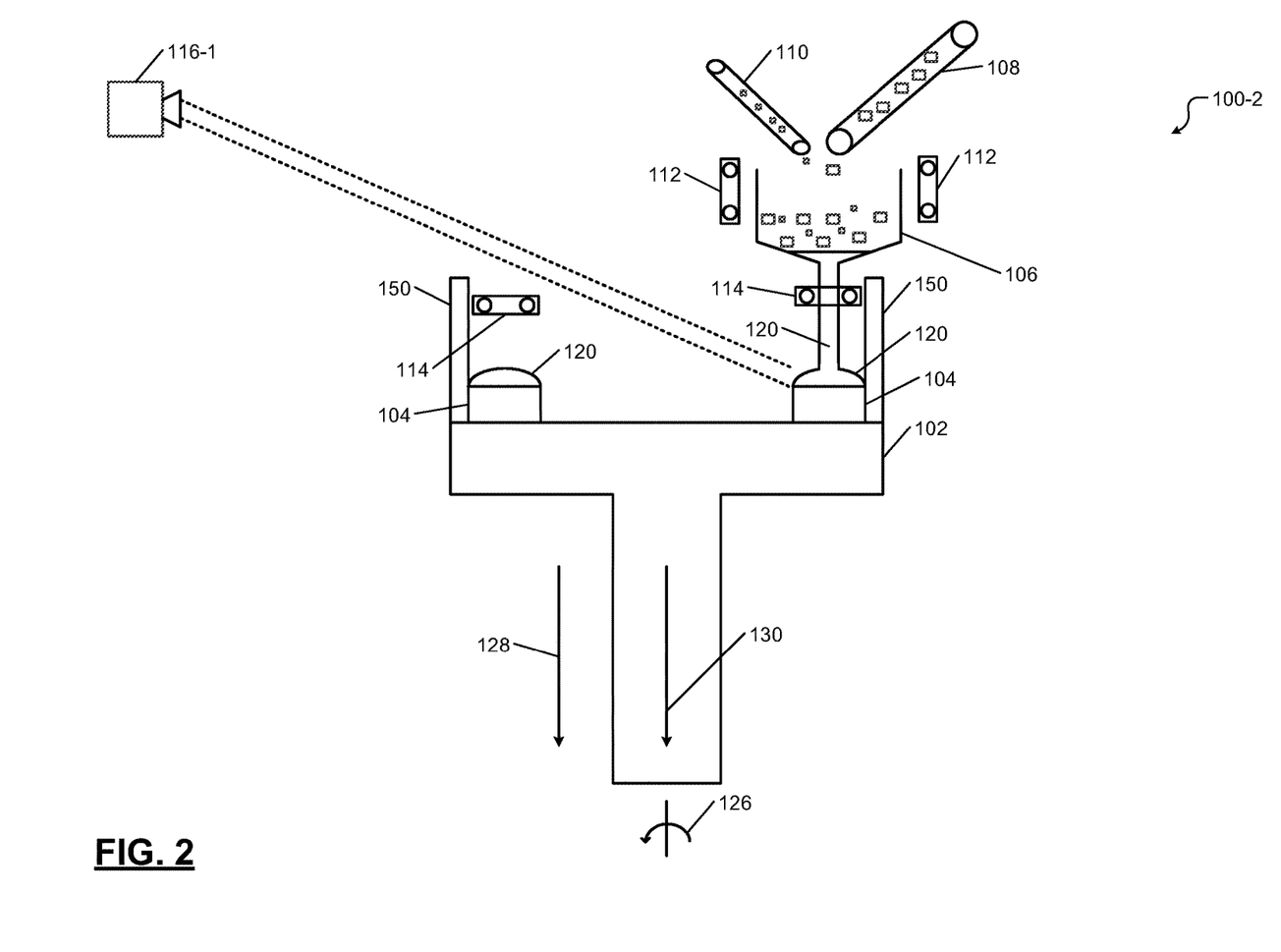

Referring now to FIG. 2, a system 100-2 for casting near net shape ingots from a material including silicon is shown, where the liquid silicon 120 is fed onto a shaped seed 104 with a quartz tube 150 used on the outer diameter to control the diameter of the crystal. In this example, inner diameter (ID) can be controlled by rotation speed of the pedestal/ crystal. Higher speed causes more centrifugal force on the liquid meniscus and the inner diameter to increase. Lower rotation speed causes the inner diameter to decrease. A camera (e.g., 116-1) is used for ID control. While not shown, the system 100-2 uses the controller 118 of the system 100-1 shown in FIG. 1B.

Figure 3:
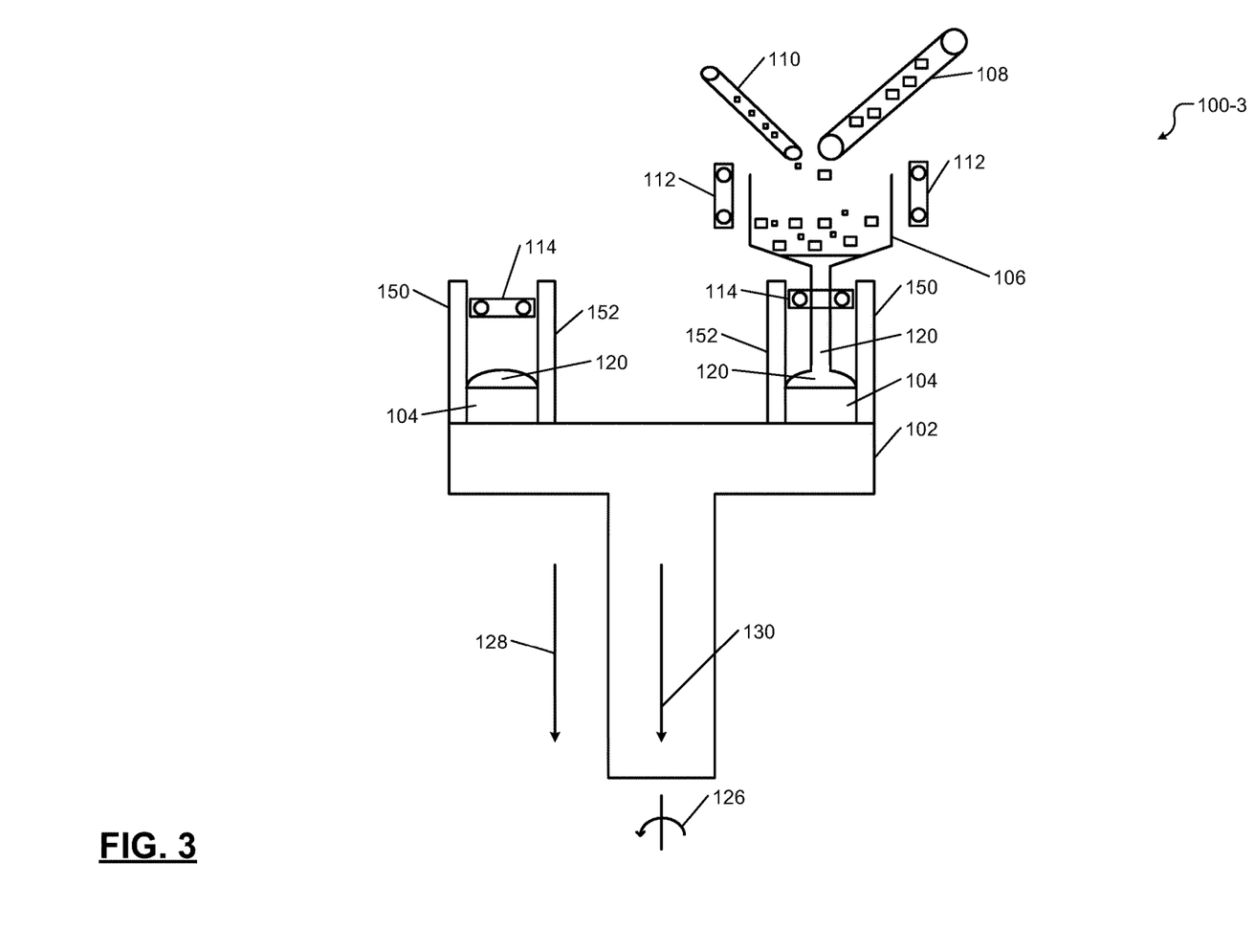

Referring now to FIG. 3, a system 100-3 for casting near net shape ingots from a material including silicon is shown, where the liquid silicon 120 is fed onto a shaped seed 104 with quartz tubes 152 and 150 used on inner and outer diameters to control the shape of the crystal. While not shown, the system 100-3 uses the controller 118 of the system 100-1 shown in FIG. 1B.

Feed rate is controlled using the controller 118 such that the ratio of doped to un-doped material provides the correct amount of dopant (e.g., boron) to achieve desired doping level of the ingot. Doped material may include elemental boron, boron silicide, "Master Alloy" (i.e., silicon doped to a high level (>1020 at/cm$^3$), and/or silicon feedstock with a surface treatment.

Additionally, quartz tubes 150 and 152 may be added to the outer diameter of the seed 104, the inner diameter of the seed 104, or both inner and outer diameters of the seed 104 to define the ingot geometry (e.g., the inner and outer diameters).

Figure 4A:
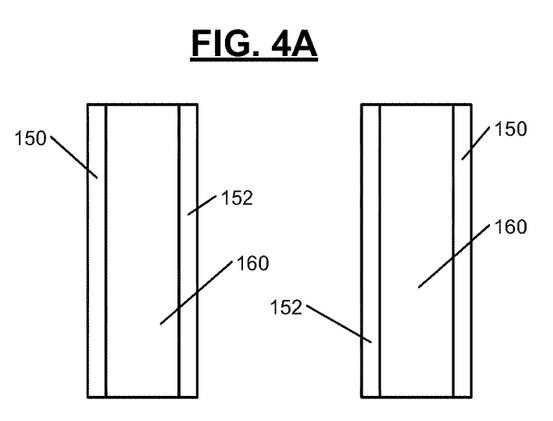
FIGS. 4A-4D are side cross-sectional views of inner and outer tube walls.
Figure 4B:
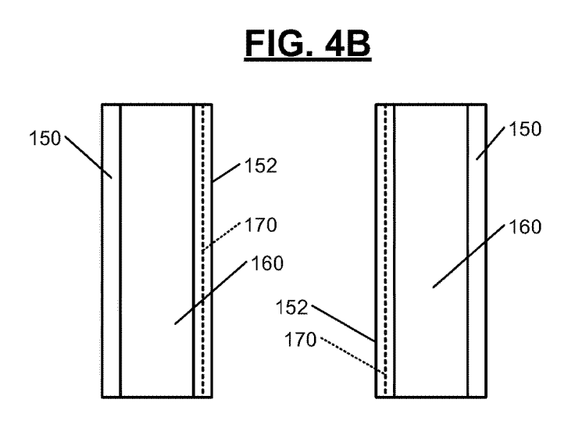
Figure 4C:
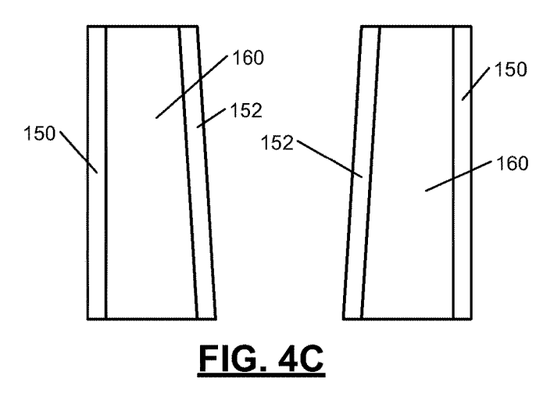
Figure 4D:
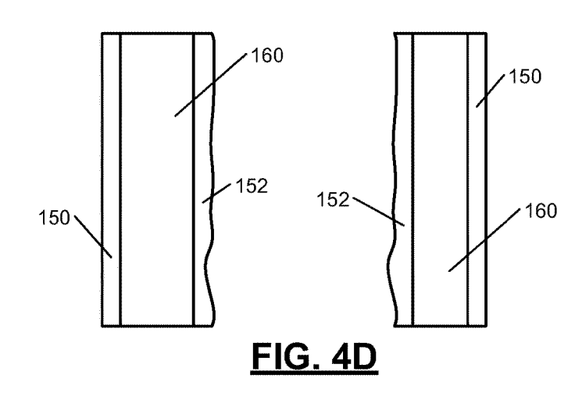

Referring now to FIGS. 4A to 4D, an inner quartz tube defines the shape of the ingot, and modifications to the design to avoid residual stress buildup due to mismatch between quartz and silicon coefficients of thermal expansion. In FIG. 4A, inner crucible walls 152 and outer crucible walls 150 define the shape of the ingot 160. In FIG. 4B, the inner tube 152 has stress relief mechanism shown at 170, such as stress riser, cracks, or other features designed to cause the inner wall to yield/break during cool down before unacceptable levels of stress build in the ingot 160. In FIG. 4C, a conical inner tube with slanted inner walls 152 is shown. The crucible geometry is defined in a way that promotes relative motion between the crucible and ingot (e.g., inner wall can move upwards during cooldown so that it does not constrain the contraction of the ingot). In FIG. 4D, the inner wall 152 of the crucible may be made from a different material (i.e., other than quartz) with preferable properties. Examples include silicon nitride, silicon carbide, silica or quartz doped with boron or another dopant(s) to lower the yield strength or decrease viscosity at elevated temperatures.

If a quartz tube is used for the inner diameter geometry control (as shown in FIG. 4A), a problem may arise due to the different coefficients of thermal expansion (CTE) of silicon and quartz. In particular, quartz has a lower CTE than silicon. As the silicon cools from melting temperature to room temperature, the inner diameter will decrease faster than the diameter of the inner quartz tube. This can lead to a condition of tensile stress inside the silicon ingot and compressive stress in the inner quartz tube, which may lead to cracking. To prevent the buildup of stress, several possible solutions are used. One or more "stress risers" are added to the inner quartz tube to allow the tube to crack at a lower stress than for an unmodified tube (e.g., as shown in FIG. 4B). The inner tube can be shaped with a conical design (e.g., as shown in FIG. 4C) allowing the tube to move in the vertical direction relative to the ingot as the ingot cools.

The material properties of the inner tube (e.g., by addition of dopants to the material used to fabricate the tube) can be modified to decrease viscosity/stiffness at high temperatures to allow plastic deformation or "flow" to avoid imposing stress on the ingot (e.g., as shown in FIG. 4D). Modifying material properties of the inner tube (e.g., by addition of dopants to the materials used to fabricate the tube) may be used to increase or match CTE with silicon (e.g., as shown in FIG. 4D). Examples include making the inner tube from borosilicate glass, silicon nitride, silicon carbide, or graphite, all of which have CTE similar or larger than silicon.

If a crucible of quartz or another material is used to control the geometry of the ingot (inner diameter, outer diameter, or both), it may be advantageous to coat the crucible walls (inner wall, outer wall, or both). The coating prevents sticking of the ingot to the crucible material, and promotes release of the ingot after cooling. This may allow re-use of the crucible for multiple ingots. The coating may also control nucleation and grain size of the material, heat transfer and crystallization rate, and/or impurity incorporation from crucible materials.

The coating may include silicon nitride powder or another suitable material that is compatible with direct contact with liquid silicon. The powder coating may be applied with or without a binder material to enhance the coating properties. The binder material may be removed during subsequent heating of the coating, prior to using the crucible. The coating may be applied by a spraying process, or another suitable process for applying a powder coating. After application, the powder coating may be heated to cause partial sintering or hardening, or may be used without further heat treatment.

Figure 5:
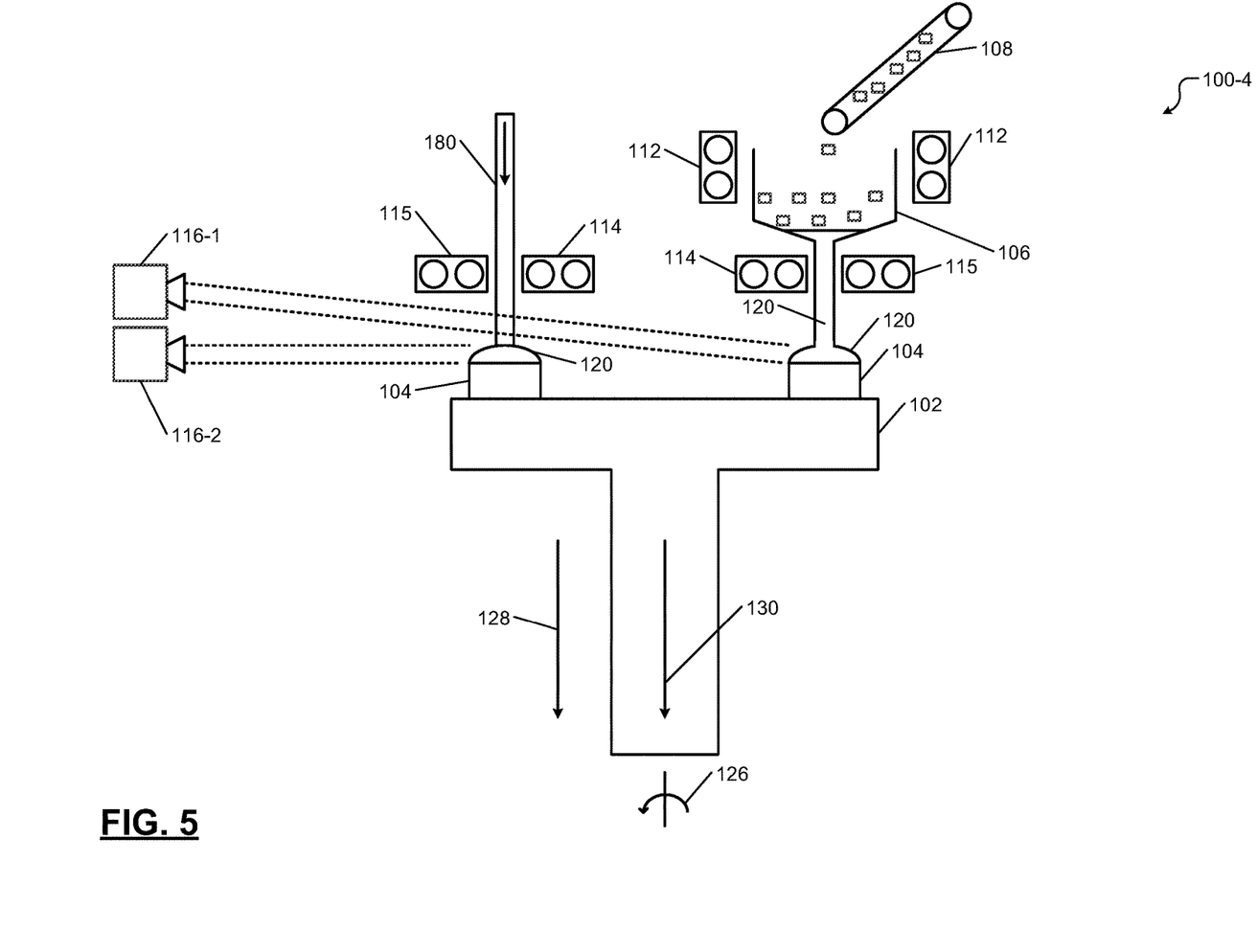
FIGS. 5 and 6 are functional block diagrams of examples of systems for casting near net shape ingots from a material including silicon according to the present disclosure.

Referring now to FIG. 5, a system 100-4 for casting near net shape ingots from a material including silicon is shown, where the liquid silicon 120 is fed onto a shaped seed 104 with a solid rod of dopant (e.g., boron "Master Alloy") being melted directly into the liquid meniscus to provide uniform doping to the crystal. In this example, a solid rod of dopant material 180 may be introduced directly into the liquid meniscus and melted at the interface (e.g., as shown below in FIG. 5), providing a controlled source of dopant. While not shown, the system 100-4 uses the controller 118 of the system 100-1 shown in FIG. 1B.

In another implementation, feedstock may be doped before it is loaded into the feeding system (hopper) of the furnace. For example, the surface of the silicon feedstock is coated or sprayed with a boron-containing solution (e.g., boric acid, boron oxide, boron-containing spin-on glass or spin-on dopant, etc.) or by using feedstock with a suitable concentration of boron (e.g., silicon that was produced by a melting and crystallization process during which boron was introduced).

Figure 6:
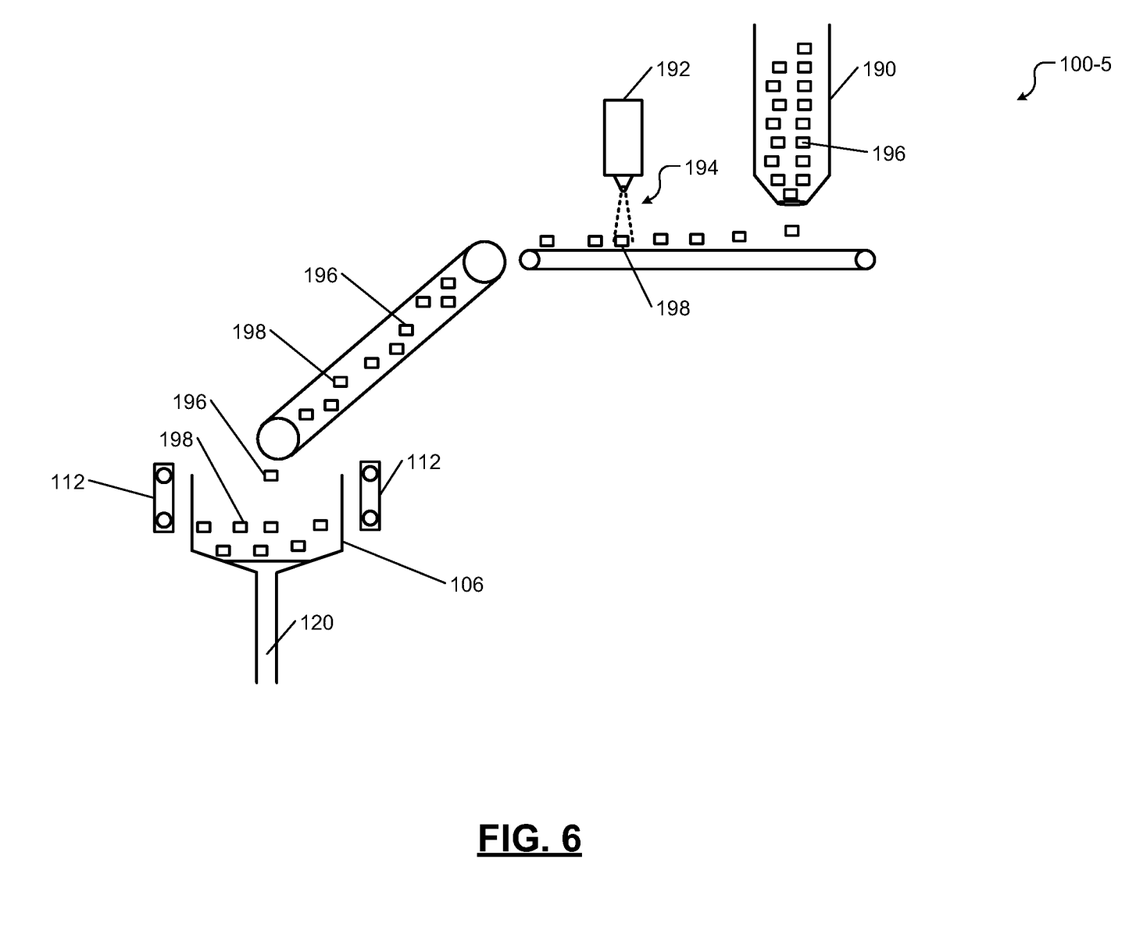

Referring now to FIG. 6, a system 100-5 for casting near net shape ingots from a material including silicon is shown. The system 100-5 uses in-situ doping by application of a sprayed-on boron-containing solvent is shown. The system 100-5 is shown only partially. While the remainder of the system 100-5 is not shown, it is understood that the system 100-5 comprises other elements shown in one or more of FIGS. 1A-5. The system 100-5 comprises a hopper 190 for feeding solid feedstock and a sprayer 192 to spray dopant (shown at 194) on the feedstock before supplying the feedstock to the melting crucible 106. The controller 118 (shown in FIG. 1B) may control the sprayer 192 to spray dopant on the feedstock continuously or intermittently to achieve desired doping level.

For example, solution of boron (boric acid, boron spin-on dopant, or similar) is applied to feedstock continuously or intermittently to achieve desired doping level. Optionally, a heater or drier (not shown) may be used to evaporate solvent prior to feedstock being fed into the melting crucible. In this example, silicon feedstock may be treated by spraying their surface with a boron-containing solution (e.g., boric acid, boron oxide, boron-containing spin-on glass or spin-on dopant, etc.) as they transition from the hopper 190 into the feeding system, before melting (e.g., as shown in FIG. 6). This pre-treatment may be done on all or a fraction of the feedstock. Thus, a mixture of doped and undoped silicon chunks (shown at 196 and 198) is fed into the melting crucible 106

For any of the techniques describe above, other dopant species other than boron (e.g., phosphorous, gallium, arsenic, antimony) may be applied in a similar manner. Co-doping (i.e., including more than one type of dopant) may also be applicable in the manner described.

The techniques described above may be used to produce materials with a wide range of resistivity, by varying the ratio of doped vs undoped silicon fed to the replenishment system. In principle, ingots may be produced with resistivity ranging from very high (>1000 Ω-cm) to very low (<0.005 Ω-cm).

The systems and methods described herein use silicon material more efficiently. The ingot grown by the proposed technique matches closely to the size of the final part to be machined, so minimal removal of material is required. This leads to a higher material utilization yield and lower cost.

The systems and methods described herein produce less contamination. The ingot is grown directly on a silicon seed, and no crucible is required to shape the ingot. This reduced contamination levels, as no foreign (non-silicon) material is in contact with the ingot as it is grown. Expected result is lower concentrations of oxygen, nitrogen, and metallic impurities, as well as fewer inclusions of silicon nitride and silicon carbide.

The systems and methods described herein have higher throughput. Because the silicon is melted in a separate crucible from the ingot growth area, it can occur in parallel with the growth of the ingot, leading to a cycle time reduction. Expected pull speed is also higher than for Directional Solidification System (DSS) casting of solid ingots due to the increased surface area/volume from the ring-shape of the ingot. This will lead to overall shorter process time and increased yield from the process.

The systems and methods described herein disclose feeding of liquid silicon onto a ring-shaped seed to define the shape of the ingot, including an off-center feeding system and a rotating crystal. Growth rings of ingots are enabled to near net chamber part shape for optimal material utilization and minimal waste, leading to reduced cost. The need for a crucible is partially or completely eliminated, resulting in lower contamination levels (metallic and oxygen) and improved material quality The systems and methods described herein also improve throughput by separating melting and freezing processes to different zones of the process equipment to reduce cycle time and increase material output per machine (e.g., as shown in FIGS. 1A-3). The systems and methods use various mechanisms to control geometry of ingot (inner and outer diameter). Camera-based feedback may be used on inner and outer diameters of the ingot. Inner and outer heater zones are used to control the shape of inner and outer meniscus angle, (inner diameter and outer diameter). Rotation speed is used to control inner and outer meniscus angle, ID/OD. A liquid silicon feed rate is used to control inner and outer meniscus angle, ID/OD.

Various ways of doping of the crystal are disclosed. In some examples, two streams of solid feedstock are used. One stream includes un-doped polysilicon and another stream include boron in one of several forms (e.g., elemental boron, boron-silicon alloy, silicon with a coating of boron-containing substance, melting of a rod of boron-silicon "Master Alloy" directly into the liquid meniscus).

In other examples, the systems and methods use of a solvent-based boron source to spray the feedstock before or as it is being fed into the replenishment system. Feedstock containing dopant is imparted in a previous melting/freezing process.

Figure 7:
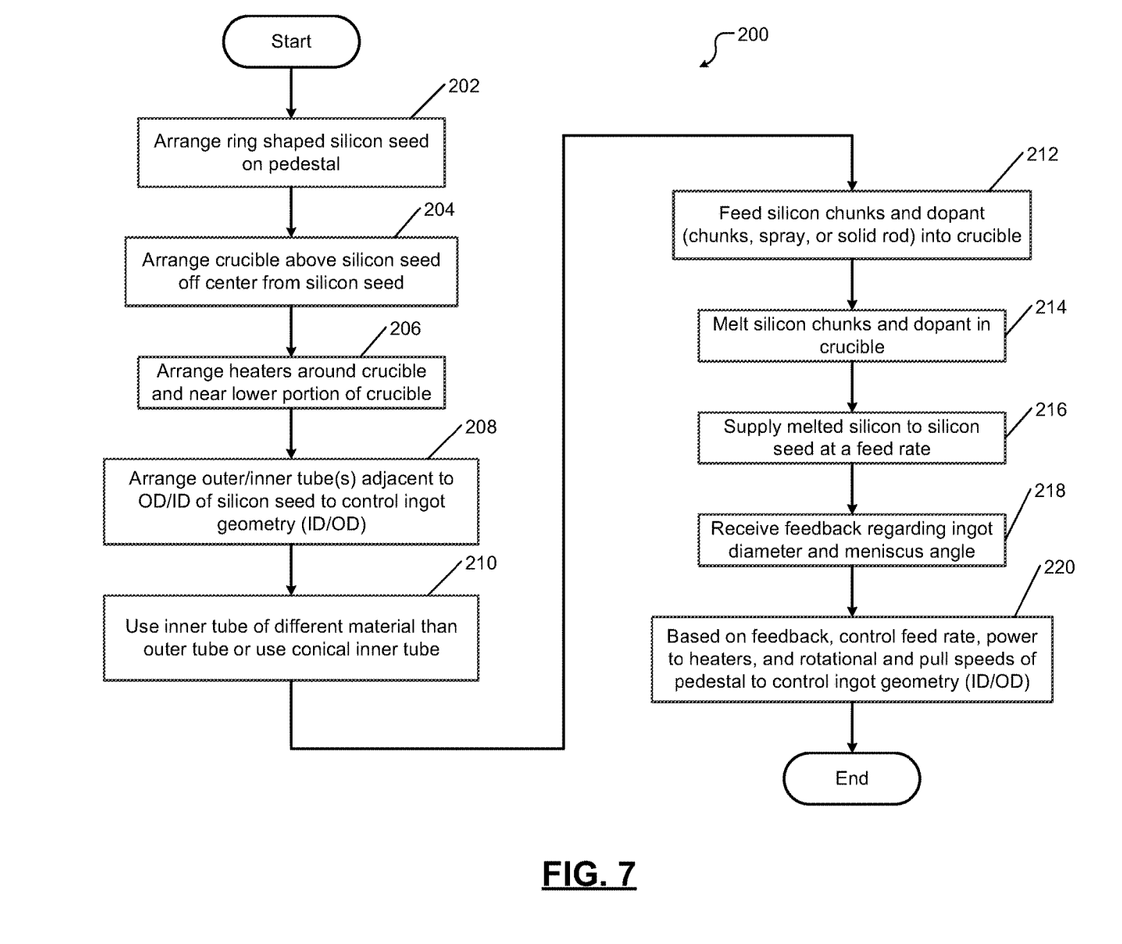
FIG. 7 is a flowchart of an example of a method for casting near net shape ingots from a material including silicon according to the present disclosure.

Referring now to FIG. 7, a method 200 for casting near net shape ingots from a material including silicon is shown. The control described in the method 200 may be performed by the controller 118 shown in FIG. 1B and one or more of the systems shown in FIGS. 1A and 2-6. The term control in the following description indicates code stored in a memory of the controller 118 and executed by a processor of the controller 118 to perform the described functionality.

At 202, a ring shaped silicon seed (e.g., the silicon seed 104) is arranged on a pedestal (e.g., the pedestal 102). At 204, a crucible (e.g., the melting crucible 106) is arranged above the silicon seed off-center from the silicon seed. At 206, heaters (e.g., the heaters 112, 114, 115) are arranged around the crucible and near a lower portion of the crucible through which melted silicon is supplied from the crucible to the silicon seed. At 208, outer/inner tube(s) (e.g., elements 150, 152) are arranged adjacent to the OD/ID of the silicon seed as shown in FIGS. 2-4D. At 210, the inner tube (e.g., element 152) may be made of a different material than the output tube or may be conical in shape as described with reference to FIGS. 4A-4D.

At 212, chunks of solid silicon are fed into the crucible from a feeding system arranged above the crucible. A dopant may be added using any one of the ways of adding dopant shown in FIGS. 1A-6. At 214, the solid silicon and the dopant are melted in the crucible using heaters (e.g., the heaters 112) surrounding the crucible. At 216, the melted silicon is supplied from the crucible to the silicon seed at a feed rate.

At 218, control (e.g., the controller 118) receives feedback regarding the diameter and the meniscus angle of the ingot while the melted silicon is supplied to the silicon seed and while the ingot is forming. The feedback is received from various sources shown in FIG. 1B. At 220, based on the feedback, while the melted silicon is supplied to the silicon seed and while the ingot is forming control adjusts the feed rate, power supply to the heaters (112, 114, 115), and rotational and pull speeds of the pedestal control the geometry (ID/OD) of the ingot.

Accordingly, the systems and methods of the present disclosure described above produce a silicon ingot with a "ring" shape (i.e. a hollow cylinder), by first melting silicon and then feeding the liquid silicon into an area which defines the shape of the growing ingot. The shape definition may be provided by several techniques, including the shape of the seed, an inner wall, an outer wall, an inner and outer wall, or a crucible with the desired ingot shape.

One method comprises using a ring-shaped silicon seed of the same cross-sectional area/shape as the desired ingot, to begin the growth of the ingot (see FIG. 1A). The seed is first partially melted (from the top). The seed is then moved in the downwards direction, away from the heaters, while liquid silicon is added to the top of the seed by a liquid replenishment system. Moving away from the heaters causes the liquid silicon to freeze and elongate (grow) the ingot on top of the seed. Meanwhile continual addition of liquid melt to the top of the growing ingot, in the hot-zone of the heaters, maintains a liquid zone with a liquid-solid interface.

Another method comprises the use of a ring-shaped silicon seed of the same cross-sectional area/shape as the desired ingot, with a quartz tube of the same or similar outer diameter, which constrains the added liquid silicon and defines the outer diameter of the growing ingot (see FIG. 2).

A further method comprises the use of a ring-shaped silicon seed of the same cross-sectional area/shape as the desired ingot, with quartz matching the inner and outer diameters of the seed, which constrain the added liquid silicon and defines the inner and outer diameter of the growing ingot (see FIGS. 3 and 4A). In one implementation, the inner quartz tube may be modified in such a manner as to decrease its mechanical strength, to allow cracking at a lower stress level (see FIG. 4B). This can prevent residual stress formation in the ingot during cooldown which would otherwise occur due to the relatively high coefficient of thermal expansion of silicon relative to quartz.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system comprising:
a silicon seed arranged on a pedestal, wherein the silicon seed is ring shaped and is configured to receive melted silicon at a feed rate to form an ingot, and wherein the pedestal is configured to rotate at a rotational speed; and
a controller configured to, while the silicon seed receives the melted silicon and while the ingot is forming:
receive feedback regarding a diameter of the ingot and regarding an angle of a meniscus of the ingot, and
control the rotational speed of the pedestal and the feed rate of the melted silicon based on the feedback to control the diameter of the ingot and the angle of the meniscus of the ingot.

2. The system of claim 1 wherein the silicon seed receives the melted silicon from a feeding system positioned above the silicon seed and away from a center of the silicon seed.

3. The system of claim 1 wherein the controller receives the feedback from a camera directed to the meniscus of the ingot.

4. The system of claim 1 further comprising:
a crucible configured to receive pieces of solid silicon, the crucible arranged above the silicon seed and away from a center of the silicon seed; and
a heater associated with the crucible configured to melt the pieces of solid silicon,
wherein the controller outputs a control signal based on the feedback to move the pedestal downward from the crucible and the heater at a speed while the silicon seed receives the melted silicon from the crucible and while the ingot is forming, and
wherein the speed at which the pedestal moves downward from the crucible and the heater controls the diameter of the ingot and the angle of the meniscus of the ingot.

5. The system of claim 4 further comprising:
heaters associated with a lower portion of the crucible that is configured to feed the melted silicon to the silicon seed,
wherein the controller controls power supplied to the heaters based on the feedback to control the diameter of the ingot.

6. The system of claim 4 further comprising a sprayer to at least intermittently spray the pieces of solid silicon with a dopant before the pieces of solid silicon are fed into the crucible.

7. The system of claim 1 further comprising:
a quartz tube associated with an outer diameter of the silicon seed to control an outer diameter of the ingot,
wherein the controller controls an inner diameter of the ingot by controlling the rotational speed of the pedestal based on the feedback.

8. The system of claim 1 further comprising outer and inner quartz tubes associated with outer and inner diameters of the silicon seed to control outer and inner diameters of the ingot.

9. The system of claim 8 wherein:
the inner quartz tube comprises a stress relief feature designed to cause the inner quartz tube to yield or break while the ingot cools; or
the inner quartz tube is conical in shape.

10. The system of claim 1 further comprising an outer quartz tube and an inner tube associated with outer and inner diameters of the silicon seed to control outer and inner diameters of the ingot, wherein the inner tube is made of a material other than quartz.

11. The system of claim 1 further comprising a solid rod of a dopant arranged to melt directly into the meniscus of the ingot.

12. A method comprising:
feeding a silicon seed arranged on a pedestal with melted silicon at a feed rate to form an ingot, the silicon seed being ring shaped, and the pedestal being configured to rotate at a rotational speed; and
while the silicon seed receives the melted silicon and while the ingot is forming:
receiving, from a camera directed to a meniscus of the ingot, feedback regarding a diameter of the ingot and regarding an angle of the meniscus of the ingot, and
controlling the rotational speed of the pedestal and the feed rate of the melted silicon based on the feedback to control the diameter of the ingot and the angle of the meniscus of the ingot.

13. The method of claim 12 further comprising:
positioning a feeding system above the silicon seed and away from a center of the silicon seed; and
supplying the melted silicon from the feeding system to the silicon seed at the feed rate.

14. The method of claim 12 further comprising:
arranging a crucible above the silicon seed and away from a center of the silicon seed;
supplying pieces of solid silicon to the crucible while selectively spraying the pieces of solid silicon with a dopant before feeding the pieces of solid silicon into the crucible;
melting the pieces of solid silicon using a heater associated with the crucible;
moving the pedestal downward from the crucible and the heater at a speed while the ring shaped silicon seed receives the melted silicon from the crucible and while the ingot is forming; and
controlling, based on the feedback, the speed at which the pedestal moves downward from the crucible and the heater to control the diameter of the ingot and the angle of the meniscus of the ingot.

15. The method of claim 14 further comprising:
arranging heaters proximate to a lower portion of the crucible that is configured to feed the melted silicon to the silicon seed; and
controlling power supplied to the heaters based on the feedback to control the diameter of the ingot.

16. The method of claim 12 further comprising:
controlling an outer diameter of the ingot by arranging a quartz tube proximate to an outer diameter of the silicon seed; and
controlling an inner diameter of the ingot by controlling the rotational speed of the pedestal based on the feedback.

17. The method of claim 12 further comprising controlling outer and inner diameters of the ingot by arranging outer and inner quartz tubes proximate to outer and inner diameters of the silicon seed.

18. The method of claim 17 wherein:
the inner quartz tube comprises a stress relief feature designed to cause the inner quartz tube to yield or break while the ingot cools; or
the inner quartz tube is conical in shape.

19. The method of claim 12 further comprising controlling outer and inner diameters of the ingot by arranging an outer quartz tube and an inner tube proximate to outer and inner diameters of the silicon seed, wherein the inner tube is made of a material other than quartz.

20. The method of claim 12 further comprising arranging a solid rod of a dopant to melt directly into the meniscus of the ingot.

* * * * *